United States Patent [19]
Sato et al.

[11] Patent Number: 5,400,189
[45] Date of Patent: Mar. 21, 1995

[54] MAGNETIC RECORDING AND REPRODUCING APPARATUS, REPRODUCTION SIGNAL PROCESSING APPARATUS, AND REPRODUCTION SIGNAL PROCESSING METHOD

[75] Inventors: Naoki Sato, Kokubunji; Yasuhide Ouchi, Kodaira; Hirotsugu Kojima, Tokorozawa; Hideki Sawaguchi, Kodaira; Yosuke Hori, Hiratsuka, all of Japan

[73] Assignee: Hitachi, Ltd., Tokyo, Japan

[21] Appl. No.: 33,759

[22] Filed: Mar. 18, 1993

[30] Foreign Application Priority Data

Mar. 19, 1992 [JP] Japan .................................. 4-063547
May 11, 1992 [JP] Japan .................................. 4-117326

[51] Int. Cl.⁶ ..................... G11B 5/035; G11B 5/09; H03H 7/30; H03K 5/159
[52] U.S. Cl. .......................... 360/65; 360/32; 360/46; 375/14
[58] Field of Search ................. 360/46, 48, 49, 65, 360/66; 375/11, 12, 14, 32

[56] References Cited
U.S. PATENT DOCUMENTS 5,132,988  7/1992  Fisher et al. ..................... 375/14
5,150,379  9/1992  Baugh et al. ..................... 375/14

Primary Examiner—Donald Hajec
Assistant Examiner—T. N. Forbus, Jr.
Attorney, Agent, or Firm—Antonelli, Terry, Stout & Kraus

[57] ABSTRACT

A reproduction signal processing apparatus includes a memory circuit storing a predetermined pattern for deciding equalizing characteristics of an automatic equalizer in response to variation of a reproduction signal, a pattern converting circuit for converting the predetermined pattern outputted from the memory circuit into an equalization target pattern serving as a target of the equalization and correction by the automatic equalizer, an equalization error calculating circuit for producing an equalization error from the equalization target pattern and the equalization signal outputted from the automatic equalizer, and the automatic equalizer executing a partial response waveform process of the reproduction signal on the basis of the equalization error, for correcting the predetermined equalizing characteristics of the automatic equalizer by tracing the fluctuation of the reproduction signal. Thus, the equalization and correction tracing the variation of the equalizing characteristics of the automatic equalizer are executed, and also, the equalization and correction including the partial response waveform process are executed in the automatic equalizer.

20 Claims, 11 Drawing Sheets

(a)   (b)   (c)

MAGNETIC RECORDING AND REPRODUCING APPARATUS, REPRODUCTION SIGNAL PROCESSING APPARATUS, AND REPRODUCTION SIGNAL PROCESSING METHOD

BACKGROUND OF THE INVENTION

The present invention relates to a reproduction signal processing technique of a magnetic recording and reproducing apparatus and, more particularly, to a reproduction signal processing apparatus and a reproduction signal processing method in which a partial response waveform process is included in an automatic equalization to correct a non-linearity of a reproduction signal.

A partial response waveform processing technique as a signal transmitting technique has been adopted in a recording and reproducing technique of a magnetic disk apparatus. Such a technique relates to a narrow band technique for converting one information into a plurality of sampling values. By using such a technique to the magnetic recording and reproducing apparatus, the band of a signal which is recorded onto a magnetic disk is compressed and recorded, and such a narrow band signal is discriminated by a plurality of threshold values. There has been a patent literature, JP-A-2-150114 regarding the partial response waveform processing technique, in which a method of correcting tap coefficients is disclosed.

Also, there has been a technical literature, JP-A-4-205903 to correct the non-linearity of a reproduction signal. As another technique literature to correct a reproduction signal, there has been a publication entitled "Adaptive Equalization in Magnetic-Disk Storage Channels", by J.M. Cioffi, IEEE Communications Magazine, pages 14–29, February, 1990.

It is an object of the present invention to provide a magnetic recording and reproducing apparatus, a reproduction signal processing apparatus, and a reproduction signal processing method in which an automatic equalizer executes not only an equalizing correction such that an automatic equalizer traces variation of equalizing characteristics of the equalizer but also an equalizing correction including a partial response waveform process.

SUMMARY OF THE INVENTION

According to the first aspect of the present invention, there is provided a reproduction signal processing apparatus comprising: a memory circuit storing a predetermined pattern for deciding equalizing characteristics of an automatic equalizer in response to variation of a reproduction signal; a pattern converting circuit for converting the predetermined pattern outputted from the memory circuit into an equalization target pattern becoming a target of an equalizing correction by the automatic equalizer; an equalization error calculating circuit for producing an equalization error on the basis of the equalization target pattern and an equalization signal outputted from the automatic equalizer; and the automatic equalizer for executing a partial response waveform process of the reproduction signal on the basis of the equalization error and for correcting predetermined equalizing characteristics of the automatic equalizer by tracing the variation of the reproduction signal.

The pattern converting circuit has a discriminator for discriminating the polarity of the equalization signal outputted from the automatic equalizer to output a discrimination code. The pattern converting circuit converts the discrimination code from the discriminator and a predetermined pattern stored in the memory circuit into the equalization target pattern becoming a target of the equalizing correction by the automatic equalizer. The pattern converting circuit further has: a preset pattern storage memory for storing a training pattern to initialize the equalizing characteristics of the automatic equalizer; a target partial response pattern switch for converting the training pattern into an equalization pattern corresponding to a waveform after completion of the partial response waveform process; a discriminator discriminating the polarity of the equalization signal outputted from the automatic equalizer and for outputting a discrimination code; a pattern switch for selecting an equalization pattern from the training pattern on the basis of the discrimination code when the automatic equalizer is initialized; and an equalization target value selector for selecting an equalization target value from the equalization pattern.

The automatic equalizer is connected to an A/D converting circuit for converting the equalization signal outputted from the automatic equalizer into the digital signal, the A/D converting circuit is further connected to the discriminator for outputting the discrimination code formed with digital signal converted from the polarity. The automatic equalizer is further connected to a simplified discriminator for outputting the discrimination code discriminated from the polarity of the equalization signal outputted from the automatic equalizer to output at every predetermined equalization target, by supplying the discrimination code to the pattern converting circuit, an equalization target pattern is produced from the discrimination code and the predetermined pattern.

The A/D converting circuit for converting the reproduction signal into the digital signal is connected to the automatic equalizer to convert the reproduction signal supplied to the automatic equalizer into the digital signal.

A constant memory storing constants to decide the equalizing characteristics of the automatic equalizer is connected to the automatic equalizer.

An input signal level shifting section for receiving the reproduction signal is connected to the automatic equalizer, and a parameter calculating section for receiving the reproduction signal to supply a shift amount of the 0 level of the reproduction signal to the input signal level shifting section is connected to the pattern converter. Amplitudes of the positive and negative polarities are measured from an isolated wave of the reproduction signal by the parameter calculating section. Accordingly, the equalization target pattern is produced on the basis of the amplitude values. Also, the input signal level shifting section for receiving the reproduction signal is connected to the automatic equalizer and an equalization target pattern correcting section for supplying the shift amount of the 0 level of the reproduction signal is connected to the input signal level shifting section, so that the equalization target pattern is corrected on the basis of the equalization error by the equalization target pattern correcting section.

The automatic equalizer has: a first circuit for executing a partial response waveform process of the reproduction signal on the basis of the equalization error; and a second circuit for correcting predetermined equalizing characteristics of the automatic equalizer by tracing the variation of the reproduction signal. The first circuit comprises: a plurality of delay elements serially connected so as to receive the reproduction signal; multipliers connected to taps formed among the delay elements, and taps formed at both ends of the plurality of delay elements; and adders connected to the respective multipliers except for a multiplier on an input side receiving the reproduction signal among those multipliers, wherein the multiplier on the input side is connected to the adder on the input side receiving the reproduction signal, each output of the adders is sequentially connected to each of the adders at the next stage, and the equalization signal is outputted from the adder at the final stage. The second circuit comprises: a characteristics corrector receiving the reproduction signal, for calculating an updating value of the equalizing characteristics, and for outputting an up/down signal; and a group of counters holding the equalizing characteristics in correspondence to the multipliers, for supplying the equalizing characteristics to each of the multipliers in accordance with the up/down signal.

The first circuit has the even number of taps formed by serially connecting a plurality of delay elements. The number of taps of the first circuit can be set to an odd number.

According to the second aspect of the present invention, there is provided a magnetic recording and reproducing apparatus having the above reproduction signal processing apparatus comprising, in particular: an input circuit including a preamplifier for amplifying the reproduction signal, an AGC (Automatic Gain Control) circuit, and a filter; a memory circuit storing a predetermined pattern for deciding the equalizing characteristics of the automatic equalizer in response to the variation of the reproduction signal; a discriminator discriminating the polarity of the equalization signal outputted from the automatic equalizer, for outputting a discrimination code; a pattern converting circuit for converting the predetermined pattern outputted from the memory circuit into an equalization target pattern becoming a target of the equalizing correction by the automatic equalizer on the basis of the discrimination code outputted from the discriminator; an equalization error calculating circuit for producing an equalization error from the equalization target pattern and the equalization signal outputted from the automatic equalizer; and the automatic equalizer executing a partial response waveform process of the reproduction signal on the basis of the equalization error, for correcting the predetermined equalizing characteristics of the automatic equalizer by tracing the variation of the reproduction signal.

In the above magnetic recording and reproducing apparatus, at least the input circuit, memory circuit, discriminator, pattern converting circuit, equalization error calculating circuit, and automatic equalizer are assembled in an integrated circuit.

According to the third aspect of the present invention, there is provided a reproduction signal processing method of generating an equalization signal by equally correcting a variation of a reproduction signal by an automatic equalizer when reproducing recording information recorded on an information recording medium, wherein a predetermined pattern for deciding equalizing characteristics of the automatic equalizer in response to the variation of the reproduction signal is stored into a memory circuit, the pattern outputted from the memory circuit is converted by a pattern converting circuit into an equalization target pattern becoming a target of the equalization correction by the automatic equalizer, an equalization error is produced by an equalization error calculating circuit from the equalization target pattern and the equalization signal outputted from the automatic equalizer, a partial response waveform process of the reproduction signal is executed on the basis of the equalization error and the predetermined equalizing characteristics of the automatic equalizer are corrected by tracing the variation of the reproduction signal.

The equalization target pattern is converted so as to differ from the positive and negative polarities with use of a reference of a 0 level of the equalization target pattern.

A DC level of the pattern signal supplied to the automatic equalizer is adjusted by using a correction amount of the 0 level calculated from the equalization error so as to reduce an error of the 0 level of the equalization signal outputted from the automatic equalizer.

As mentioned above, the automatic equalizer including the partial response waveform process is realized, the reproduction signal processing apparatus having the automatic equalizer is realized, and further, the magnetic recording and reproducing apparatus having the reproduction signal processing apparatus is realized, so that the circuit is simplified and a high integration can be easily realized. Even in the case where the amplitudes of the positive and negative polarities of the waveform differ like a reproduction waveform by a magnetic head of the magnetoresistive effect type, the non-linear components of the reproduction signal can be eliminated without deteriorating the S/N ratio and increasing the equalization error, so that large electromagnetic converting characteristics of the magnetoresistive effect type magnetic head can be effectively used.

DESCRIPTION ON THE PREFERRED EMBODIMENTS

Figure 1:
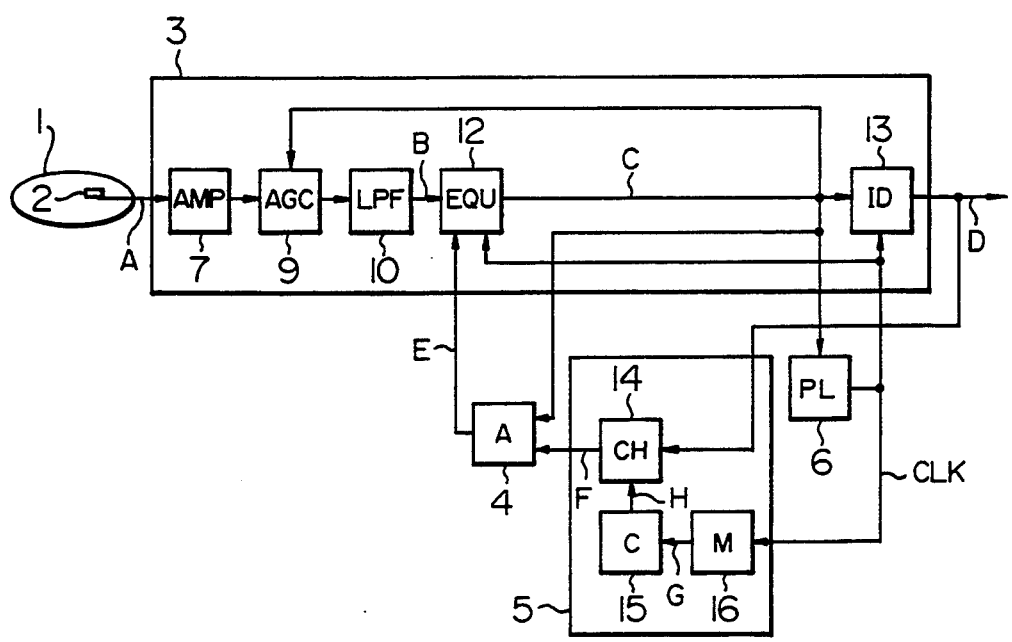
FIG. 1 is a circuit constructional diagram showing a reproduction signal processing apparatus according to the first embodiment of the present invention.

Embodiments of the present invention will be described with reference to the drawings. In order to easily understand the invention, features of the invention will be first described. According to a reproduction signal processing apparatus of the present invention as shown in FIG. 1, the apparatus includes a memory 16 storing a specific recording pattern for setting equalizing characteristics of an automatic equalizer 12, a target partial response pattern converter 15 for converting the recording pattern of the memory 16 into an equalization target pattern corresponding to an equalization waveform after completion of a waveform process of a partial response, a pattern switch 14 for switching the equalization target pattern, and an equalization error calculating section 4 calculating an output error of the automatic equalizer 12 on the basis of the equalization target pattern from the pattern switch 14, for controlling a constant setting of the automatic equalizer 12 so as to reduce the error, which has an equalization function corresponding to the partial response waveform process to be added to a signal processing circuit 3.

That is, it is a fundamental feature of the automatic equalizer 12 according to the present invention that the apparatus includes not only the conventional equalizing operation which traces variation of characteristics during the operation of the reproduction signal processing apparatus but also the equalizing operation corresponding to the partial response waveform process.

Figure 4:
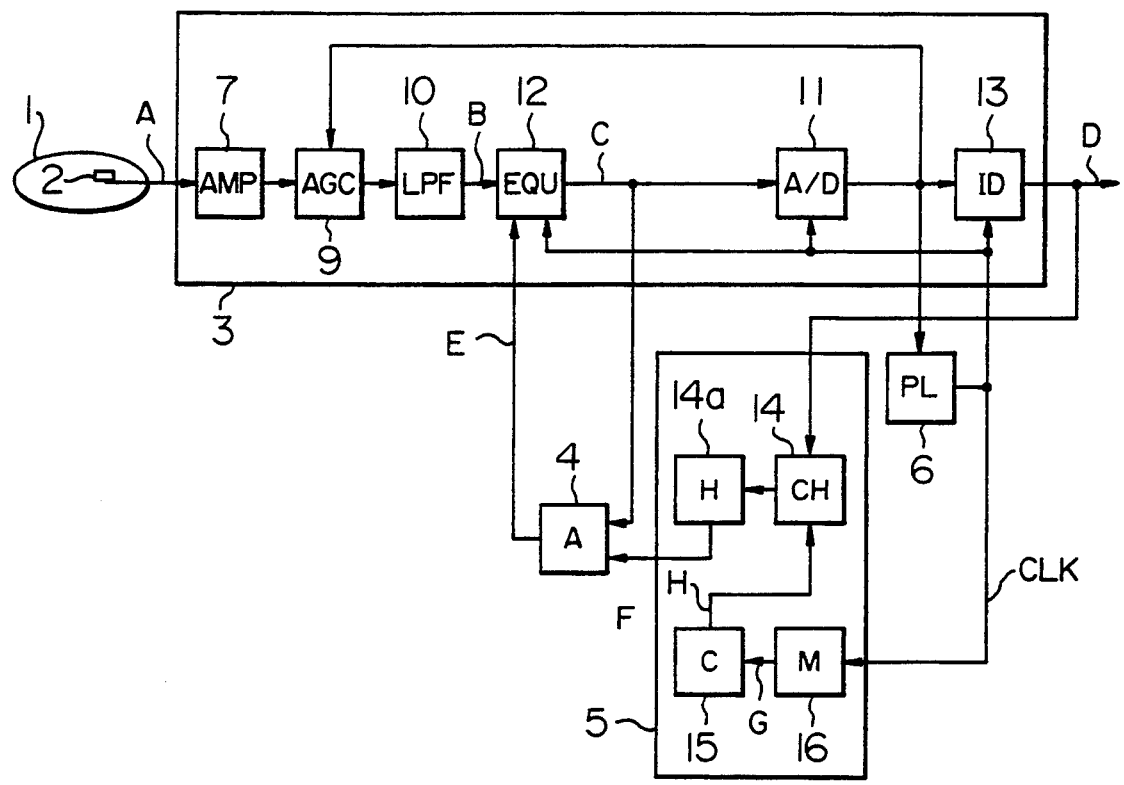
FIG. 4 is a circuit constructional diagram showing a reproduction signal processing apparatus according to the second embodiment.

As shown in FIG. 4, by connecting an A/D converter 11 between the post stage of the automatic equalizer 12 and a discriminator 13, and the discriminator 13 is of a digital construction type for discriminating reproduction data by using a digital signal, so that the discriminator 13 of a high performance handled with the digital signal can be realized. On the other hand, an equalization target value selecting section 14a for selecting an equalization target value as an equalization target pattern outputted from the pattern switch 14 is connected to the pattern switch 14 and the target partial response pattern converter 15. An equalization target value F is supplied to the equalization error calculating section 4 in place of the equalization target pattern.

Figure 5:
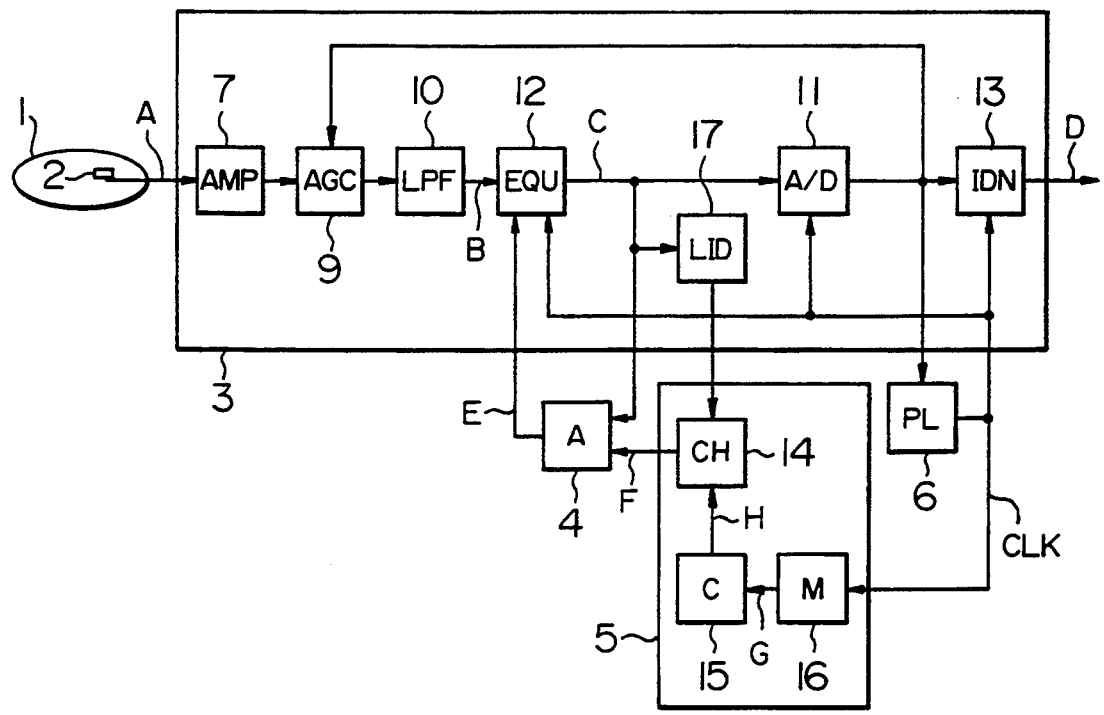
FIG. 5 is a circuit constructional diagram showing a reproduction signal processing apparatus according to the third embodiment.

As shown in FIG. 5, a simplified discriminator 17 for outputting the result of the discrimination every bit can be connected to an output of the automatic equalizer 12, when data is reproduced, an output of the simplified discriminator 17 is used as an equalization target pattern to calculate an equalization error and the characteristics of the automatic equalizer 12 are successively corrected, so that the apparatus can trace the discriminating function at a further high speed.

Figure 6:
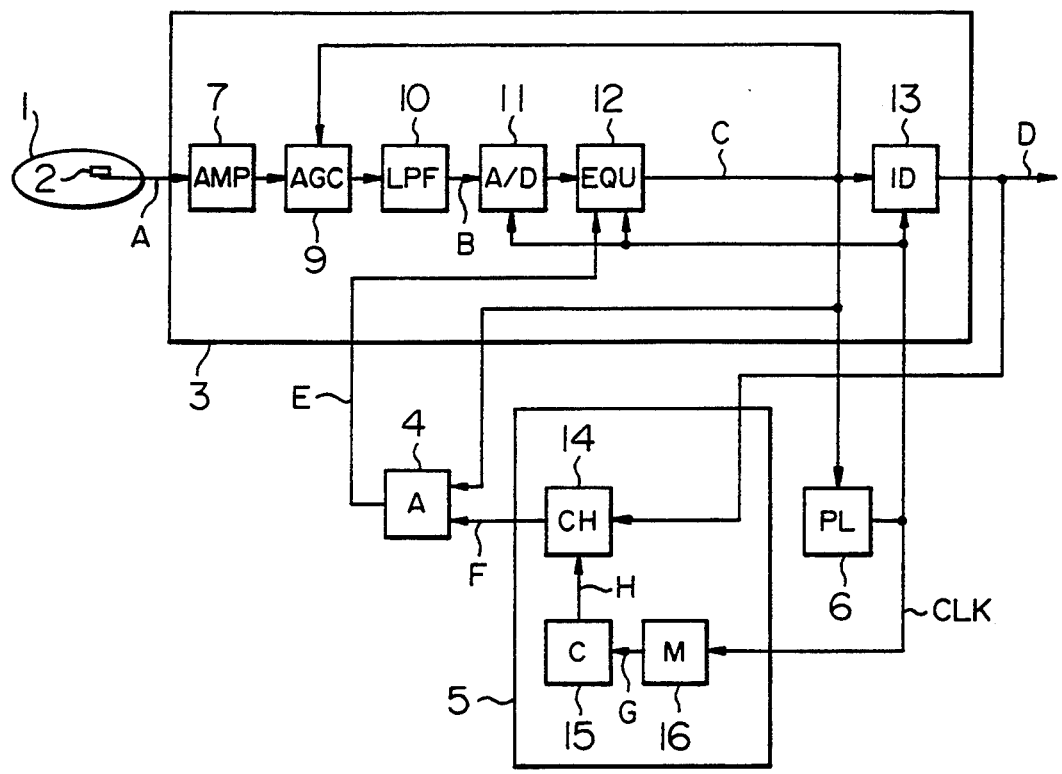
FIG. 6 is a circuit constructional diagram showing a reproduction signal processing apparatus according to the fourth embodiment.

As shown in FIG. 6, the A/D converter 11 can be connected at the front stage of the automatic equalizer 12 which uses digital signal, so that the automatic equalizer 12 and subsequent circuits can be digitally constructed, and the apparatus can be easily miniaturized.

Figure 7:
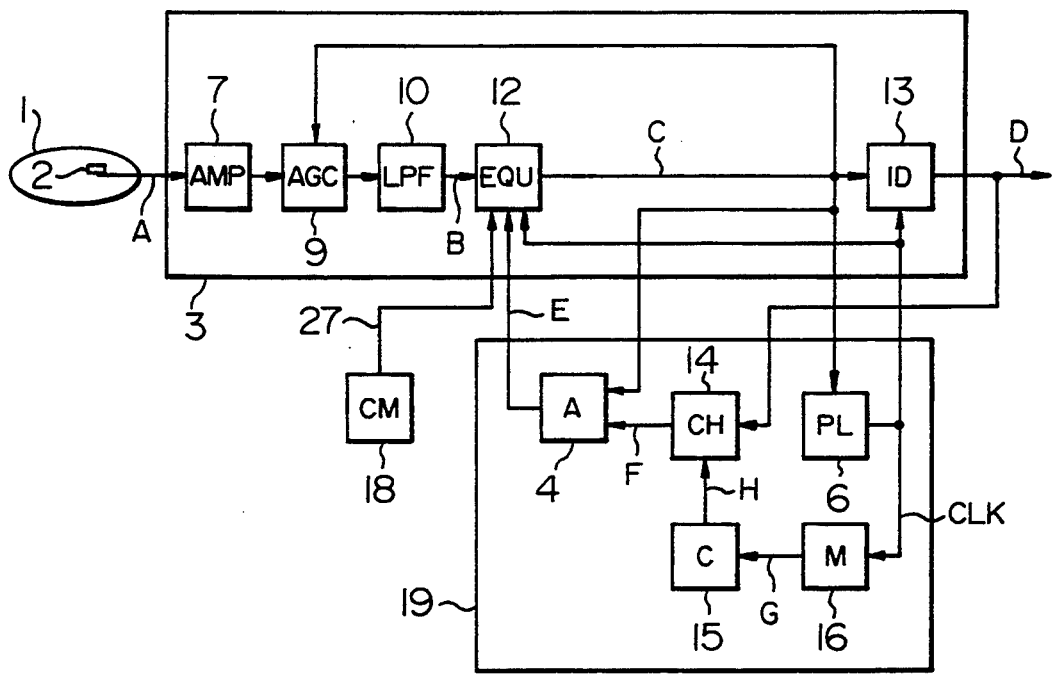
FIG. 7 is a circuit constructional diagram showing a reproduction signal processing apparatus according to the fifth embodiment.

As shown in FIG. 7, a constant memory 18 can be connected to the automatic equalizer 12, and a memory constant stored in the constant memory 18 is decided as an equalization constant of the automatic equalizer 12. So, the equalization constant is updated by providing a group of counters 23 for holding the equalization constants shown in FIG. 8 so that the content of the constant memory 18 can be updated by the equalization constant of the automatic equalizer 12. Due to this, by merely adding the constant memory 18 to set the equalization constant, there is an advantage such that the memory constant can be effectively and variably used. There is also an advantage such that the equalization constant can be easily updated in correspondence to an aging change of the magnetic recording and reproducing system or the like.

It is desirable to set the number of taps of the automatic equalizer 12 to an even number because the equalization constants near the center tap are equal since the partial response waveform process is included. The equalization of a high precision can be easily obtained.

Together with the circuit construction of the automatic equalizer 12 including the equalizing function corresponding to the partial response waveform process mentioned above, and by integrating the signal processing circuit 3, not only the signal processing circuit 3 but the magnetic recording and reproducing apparatus are miniaturized and their costs are also reduced.

A construction of the reproduction signal processing apparatus of the present invention will now be described. As shown in FIG. 1, firstly the magnetic recording and reproducing apparatus comprises: a magnetic disk 1; a head 2; a signal processing circuit 3; an equalization target pattern switching section 5; an equalization error calculating section 4; and a phase sync signal generating section 6. The signal processing circuit 3 comprises: a preamplifier 7; an AGC circuit 9; an LPF 10; an automatic equalizer 12 for automatically initializing the characteristics so as to reduce the equalization error; and the discriminator 13 for discriminating the output signal which has been equalized by the automatic equalizer 12. The equalization target pattern switching section 5 comprises: the training pattern storing memory 16 for storing a special training pattern G to initialize the equalizing characteristics of the automatic equalizer 12; the target partial response pattern converter 15 for converting the training pattern G into an equalization pattern H corresponding to the equalization waveform after the partial response waveform process was executed; and the pattern switch 14 for selecting .the equalization pattern H based on the training pattern G only when the automatic equalizer 12 is initialized. According to the construction described above, the reproduction signal processing apparatus includes all circuits shown in FIG. 1 except for the magnetic disk 1 and the head 2. The equalization error calculating section 4 obtains an equalization error E from an equalization output signal C from the automatic equalizer 12 and an equalization target pattern F. The phase sync signal generating section 6 generates a system clock CLK from the equalization output signal C from the automatic equalizer 12.

A reproduction signal A from the magnetic head 2 is amplified by the preamplifier 7 and AGC circuit 9 and unnecessary band components are eliminated from the reproduction signal A by the LPF 10. In this instance, a gain of the AGC circuit 9 is obtained by being subjected to a negative feedback control so that an amplitude of the equalization output signal C from the automatic equalizer 12 is set to a level that is necessary for discrimination. The automatic equalizer 12 corrects the equalizing characteristics of the automatic equalizer 12 in response to the characteristics of the partial response waveform process so as to reduce the equalization error E obtained by subtracting the equalization target pattern F from the equalization output signal C and reproduces discrimination data D recorded by the discriminator 13 at the post stage. As the equalization target pattern F serving as an equalization target of the automatic equalizer 12 in this instance, the equalization pattern H from the partial response pattern converter 15 is selected upon initialization. In the subsequent operation mode, the discrimination data D outputted from the discriminator 13 is selected as an equalization target pattern F. Due to this, the characteristics of the automatic equalizer 12 are initially and forcedly set to the equalizing characteristics of the automatic equalizer 12 itself including the characteristics of the partial response waveform process. After that, the characteristics of the automatic equalizer 12 trace the variation of the characteristics.

Figure 2:
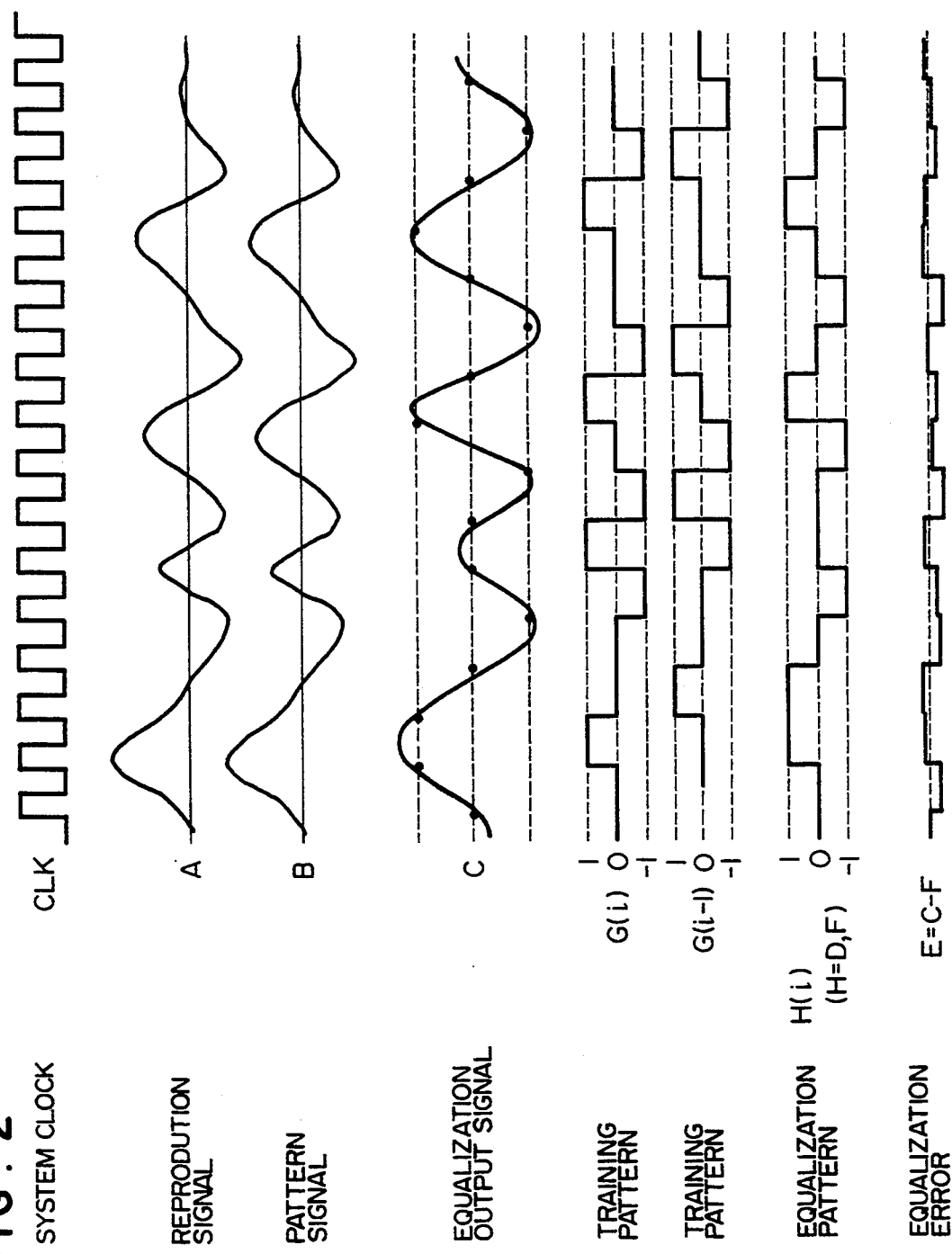
FIGS. 2 and 3 are waveform diagrams for explaining the operation of the reproduction signal processing apparatus.
Figure 3:
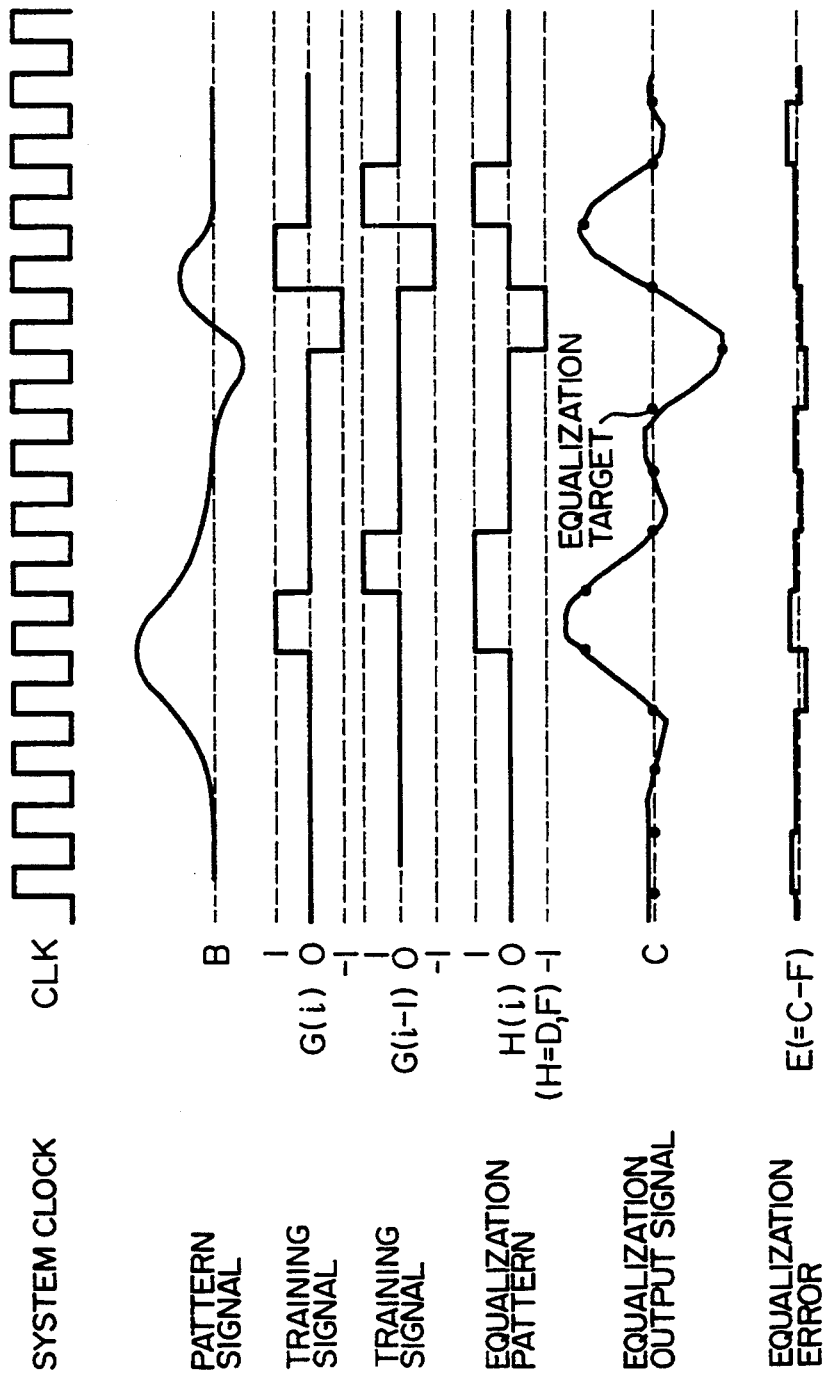

The operation of the reproduction signal processing apparatus of FIG. 1 mentioned above will now be described with reference to FIG. 2 and FIG. 3, but FIG. 3 shows the case where a pattern signal B is simplified to more easily understand the operation.

The reproduction signal A from the magnetic head 2 is amplified by the preamplifier 7 and AGC circuit 9. Unnecessary band components are eliminated from the reproduction signal A by the LPF 10, thereby obtaining the pattern signal B. In this instance, the gain of the AGC circuit 9 is obtained by being subjected to the negative feedback control so that the amplitude of the equalization output signal C is set to a level that is necessary for discrimination by the discriminator 13. The automatic equalizer 12 corrects the equalizing characteristics of itself including the characteristics (in this case, the characteristics obtained by adding the information which is preceding by one bit) of the partial response waveform process so as to reduce the equalization error E obtained by subtracting the equalization target pattern F from the equalization output signal C, thereby obtaining the equalization output signal C. Further, the discrimination data D recorded is further reproduced by the discriminator 13 at the post stage.

In this instance, the equalization error E is obtained by subtracting the equalization target pattern F (equal to the equalization target pattern H) from the equalization output signal C of the automatic equalizer 12 at the timing of the leading edge of the system clock CLK. As an equalization target pattern F serving as an equalization target, the equalization pattern H from the target partial response pattern converter 15 is selected upon initialization. In the subsequent operating mode, the discrimination data D of the discriminator 13 is selected. Due to this, the characteristics of the automatic equalizer 12 are initially and forcibly set to the equalizing characteristics of the automatic equalizer 12 itself including the characteristics of the partial response waveform process. After that, the characteristics of the automatic equalizer 12 adaptively traces the variation of the characteristics.

In the circuit construction of the automatic equalizer 12, in case of equalizing the characteristics including the characteristics of the partial response waveform process, since the equalizing characteristics obtained are gentle, such an equalization can be realized by a small circuit scale. The automatic equalizer 12 including the partial response waveform process according to the present invention can be realized by using only the equalizer of the transversal type. Further, the automatic equalizer 12 can be also formed by a dependent construction of the transversal type equalizer and a portion to execute the partial response waveform process.

The second embodiment of the reproduction signal processing apparatus of the present invention will now be described with reference to FIG. 4. The reproduction signal from the magnetic head 2 is amplified by the preamplifier 7 and AGC circuit 9. Unnecessary band components are eliminated from the reproduction signal by the LPF 10. Further, the reproduction signal is sent to the automatic equalizer 12 and the equalizing characteristics of the automatic equalizer 12 itself are corrected together with the characteristics of the partial response waveform process so as to reduce the equalization error E obtained in a manner similar to the case of FIG. 1. The equalization output signal C from the automatic equalizer 12 is converted into the digital signal by the A/D converter 11 at the post stage. The digital signal is outputted as discrimination data D by the discriminator 13 comprising a maximum likelihood decoder or the like. In this instance, the gain of the AGC circuit 9 is obtained by negative feedback controlling the discrimination data D so that the output of the A/D converter 11 is set to a level that is necessary for discrimination by the discriminator 13. The other constructions and operations are similar to those in FIG. 1. In FIG. 1, the equalization target pattern F has been used for calculating the equalization error E. However, in the embodiment, the equalization target value F outputted from the equalization target value selector 14a is used.

According to the embodiment, by providing the A/D converter 11 at the next stage of the automatic equalizer 12, the maximum likelihood decoder can be easily used and the improvement of the performance can be expected.

The third embodiment of the reproduction signal processing apparatus of the present invention will now be described with reference to FIG. 5. Since most of the construction of the third embodiment is similar to that in FIG. 4, only different points will be explained.

In the third embodiment, the simplified discriminator 17 to embody the discrimination every bit is provided on the output side of the equalization output signal C of the automatic equalizer 12. The output signal is supplied to the pattern switch 14 of the equalization target pattern switching section 5 in place of supplying the discrimination data D from the discriminator 13.

In case of using the maximum likelihood decoder for the discriminator 13, it takes a time of at least a few bits from the input of the equalization output signal C until the output of the discrimination data D as a result of the discrimination, so that there occurs a problem such that the apparatus cannot trace the sudden variation of the characteristics. According to the present invention, however, since the equalization error in the operating mode is sequentially calculated, the apparatus can trace the variation of the characteristics at a high speed.

The fourth embodiment of the reproduction signal processing apparatus of the present invention will now be described with reference to FIG. 6. Since most of construction of the fourth embodiment is similar to that of FIG. 4, only different points will now be described.

In the embodiment, the A/D converter 11 is provided at the next stage of the LPF 10 and the automatic equalizer 12 is also constructed by a digital circuit.

According to the fourth embodiment, all of the circuits from the automatic equalizer 12 to the subsequent stages can be constructed by digital circuits, so that the circuit portion can be extremely easily miniaturized and the costs of the apparatus can be largely reduced. On the other hand, since the output signal of the LPF 10 includes a very small high frequency component, an error of the sampling values due to a jittering of the sampling signal of the A/D conversion can be reduced. In the case where a sampling jitter of a similar degree can be permitted, an LPF section (not shown) in the phase sync signal generating section 6 can be also simplified by constructing by a digital circuit or the like.

Ordinarily, the equalizer using sampling values is weak for the error of the sampling phase. Therefore, in the case where the noises mixed from the outside are multiplexed to the sampling signal, a remarkable adverse influence is exerted on the equalization output signal C. Therefore, to avoid the influence by the external noises, the A/D converter 11 and the phase sync signal generating section 6 are provided in the same IC (Integrated Circuit).

The fifth embodiment of the reproduction signal processing apparatus of the present invention will now be described with reference to FIGS. 7 and 8. Since most of the construction of the fifth embodiment is similar to that in FIG. 4, only different points will now be described.

FIG. 7 is a diagram showing a whole construction of the embodiment. According to the embodiment, the equalizing characteristics of the automatic equalizer 12 are initialized at the time of the shipping or power-on of the magnetic recording and reproducing apparatus including the reproduction signal processing apparatus of the invention. In FIG. 7, the memory 18 is connected to the automatic equalizer 12. A constant 27 to decide the equalizing characteristics has been stored in the automatic equalizer 12.

In case of initializing the equalizing characteristics upon shipping of the magnetic recording and reproducing apparatus, the training pattern G stored in the training pattern switching memory 16 is previously recorded every track or sector on the magnetic disk 1 or every plurality of tracks or sectors. The automatic equalizer 12 decides the equalizing characteristics while reproducing the signal B corresponding to the training pattern G. That is, by the operations of multipliers 21 in FIG. 8, which will be explained hereinlater, the constant 27 read out from the memory 18 is corrected. For such a correction, the pattern signal B and the equalization error E outputted from the equalization error calculating section 4 are used. At a time point of the end of the correction, the updated constant 27 is again stored into the memory 18, thereby completing the initialization of the equalizing characteristics, namely, the training of the equalizer. The training pattern G may be also erased after completion of the initialization of the equalizing characteristics.

After shipping the magnetic recording and reproducing apparatus, in case of initializing the equalizing characteristics when the power source is turned on, the initialization is performed without using the training pattern switching memory 16. That is, the apparatus is shipped in a state in which the training pattern G has previously been recorded on the magnetic disk 1 at every track, every sector, or respective plurality of tracks, respective plurality of sectors. The contents in the memory 18 are updated in a manner similar to that in case of the foregoing example when the power source is turned on. However, even after completion of the updating, the training pattern G on the disk 1 must be preserved.

It is also possible to construct in a manner such that the equalizing characteristics are updated while reproducing the recording data on the magnetic disk 1, after completion of the reproduction of the recording data, the contents in the memory 18 are rewritten by the updated equalizing characteristics. In this instance, a rewritable non-volatile memory is used as the memory 18.

Figure 8:
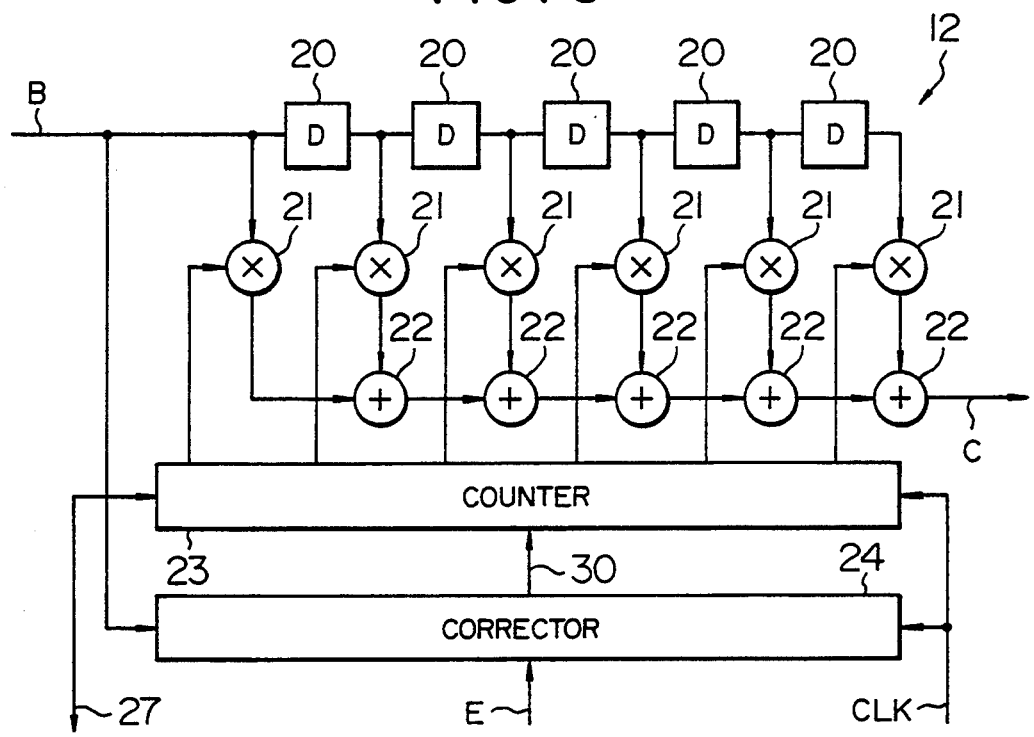
FIG. 8 is a circuit constructional diagram showing an example of an automatic equalizer according to the present invention.

FIG. 8 shows an example of the automatic equalizer 12. The automatic equalizer 12 will now be described. Reference numeral 20 denotes delay elements of taps of the automatic equalizer 12; 21 the multiplier connected to each tap; and 22 adders. A partial response waveform process is mainly executed by a circuit construction of those components 20 to 22. Reference numeral 23 denotes a group of counters which hold the equalizing characteristics of the automatic equalizer 12. The number of counters 23 is the same as the number of multipliers 21. Reference numeral 24 denotes a characteristics correcting device to calculate the updating values of the equalizing characteristics. The correcting device 24 is constructed by, for example, an exclusive-OR circuit. By the above construction, the automatic equalizer 12 of the transversal type of six taps is formed.

Since the automatic equalizer 12 includes the partial response waveform process, the equalizing characteristics at portions near the center tap are almost equal, so that the number of taps is set to an even number. An up/down signal 30 of the equalizing characteristics is obtained from the sign of the pattern signal B of the automatic equalizer 12 and the sign of the equalization error E by the pattern signal B of the automatic equalizer 12 and the equalization error E among the signals which are supplied to the characteristics correcting device 24 to obtain the updating values of the equalizing characteristics. The up/down signal 30 corresponds to the counter group 23. The up/down signal 30 counts up or down the counters 23, thereby updating the constant 27 from the memory 18. The updated constant 27 from the counters 23 and the pattern signal B are multiplied by each multiplier 21. The result of the multiplication is supplied to each adder 22. The pattern signal B is equalized by the adding operation, so that the equalization output signal C shown in FIGS. 2 and 3 is derived. The counters 23 and the memory 18 are connected by a bidirectional bus.

Figure 9:
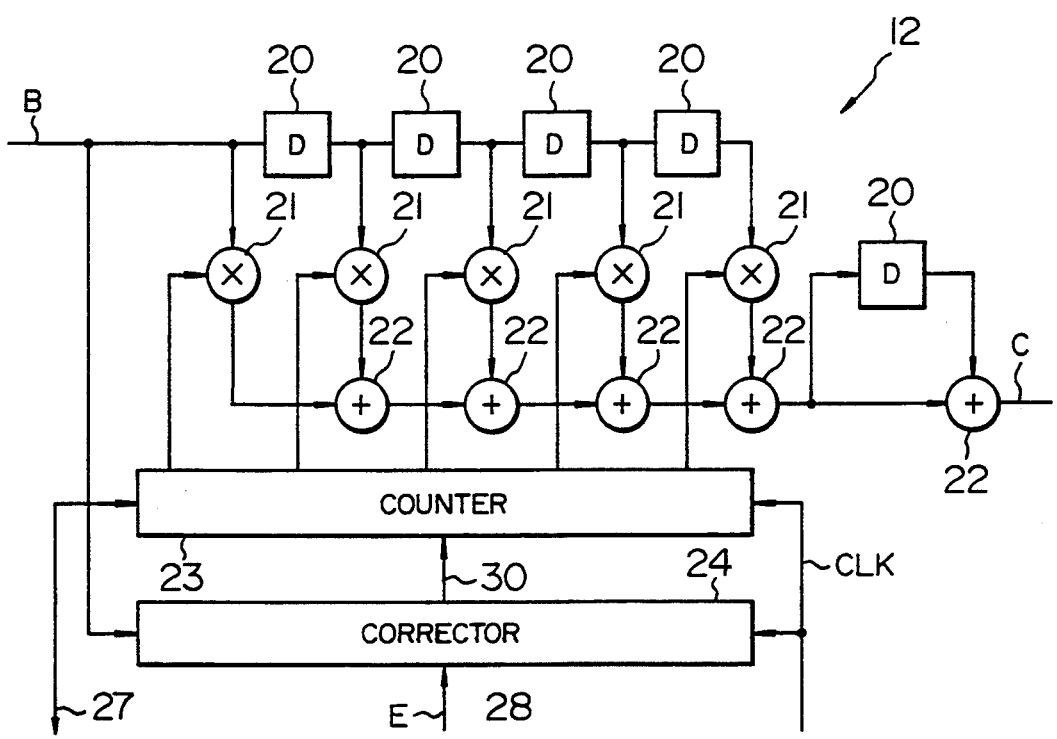
FIG. 9 is a circuit constructional diagram showing another example of an automatic equalizer.

FIG. 9 shows another example of the automatic equalizer 12. As compared with the automatic equalizer 12 of six taps shown in FIG. 8, the automatic equalizer 12 shown in FIG. 9 is of the transversal type of five taps and only the number of taps differs from that of the equalizer shown in FIG. 8.

According to the above automatic equalizer 12, by merely supplying the constant 27 to correct the equalizing characteristics from the memory 18 to the group of counters 23, the equalizing characteristics of the automatic equalizer 12 can be corrected together with the partial response waveform process so as to reduce the equalization error E.

The sixth embodiment of the reproduction signal processing apparatus will now be described with reference to FIG. 10. Although not shown, the magnetic head which is used when reproducing the recording data on the magnetic disk is not limited to the magnetic inductive type but may be of the magnetoresistive effect type.

Figure 10:
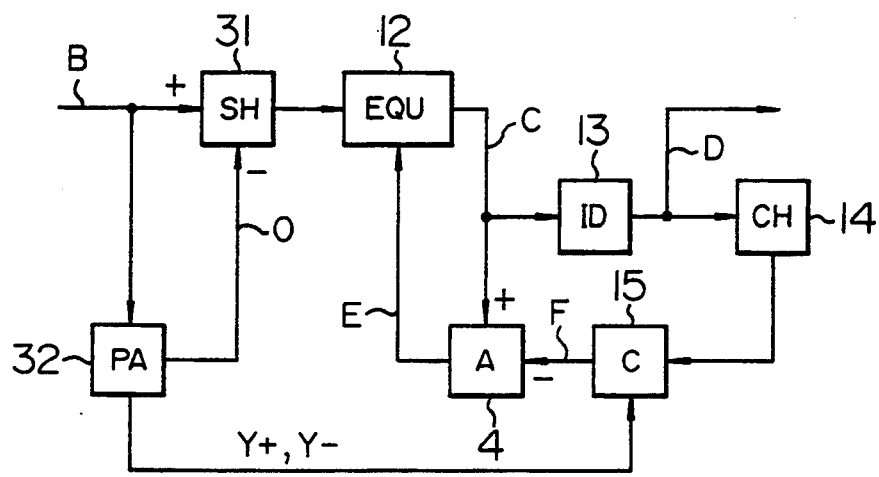
FIG. 10 is a circuit constructional diagram showing a reproduction signal processing apparatus according to the sixth embodiment.

The reproduction signal processing apparatus shown in FIG. 10 comprises: the discriminator 13 for discriminating the equalization output signal C of the linear automatic equalizer 12; the pattern switch 14 for switching from the discrimination data D as a result of the discrimination into the equalization pattern H which differs from the positive and negative signs; the target partial response pattern converter 15 for storing constants of predetermined equalizing characteristics, for selecting the equalization target pattern F on the basis of the above constants, equalization pattern H, and amplitude values $Y_+$ and $Y_-$, which will be explained hereinlater, and for outputting the selected pattern F; the equalization error calculating section 4 for calculating the equalization error E by subtracting the equalization target pattern F from the equalization output signal C; a parameter calculating section 32 for measuring an amplitude of the isolated wave of the pattern signal B, for outputting the amplitude values $Y_+$ and $Y_-$ of the positive and negative signs of the amplitude, and for outputting a shift amount O of the 0 level of the pattern signal B, namely, about $(Y_+ - Y_-)/2$; and an input signal level shifting section 31 for subtracting the shift amount O from the pattern signal B and for shifting the 0 level of the pattern signal B. In the reproduction signal processing apparatus shown in FIG. 10, the input portion of the reproduction signal A is omitted and the processes of the pattern signal B are explained.

Figure 15:
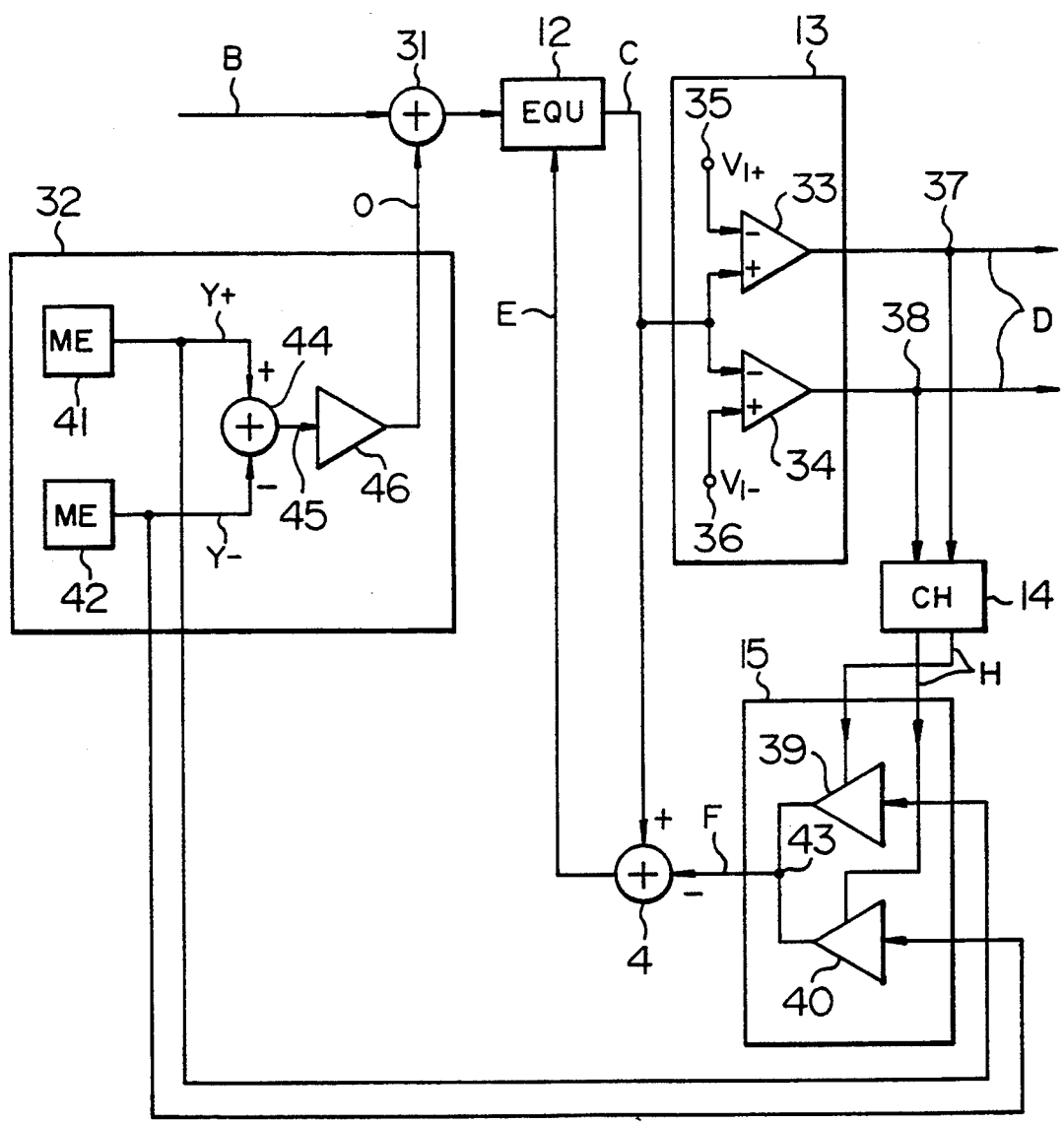
FIG. 15 is a circuit diagram showing a practical example of the reproduction signal processing apparatus shown in FIG. 10.

FIG. 15 shows a practical example of the reproduction signal processing apparatus shown in FIG. 10. The operation will now be described with reference to FIG. 15. First, the above example relates to a system in which the amplitudes of the positive and negative signs are measured from the isolated wave of the pattern signal B by the parameter calculating section 32 and the pattern signal B is automatically equalized on the basis of the amplitude values. The equalization output signal C from the automatic equalizer 12 is discriminated from discrimination potentials $V_{1+}$ and $V_{1-}$ of two comparators 33 and 34 and terminals 35 and 36. The discrimination data D as a result of the discrimination, namely, the reproduction data after completion of the correction is supplied to a point 37 corresponding to $+1$ and a point 38 corresponding to $-1$. Tri-state buffers 39 and 40 are used to select the equalization target pattern F by the pattern switch 14 for switching from the discrimination data D to the equalization pattern H which differs with respect to the positive and negative signs and by the target partial response pattern converter 15 on the basis of the equalization pattern H. In this instance, the equalization target pattern F which differs with respect to the positive and negative signs has been stored in memory devices 41 and 42. The equalization target pattern F is supplied to the tri-state buffers 39 and 40 on the basis of the amplitude values $Y_+$ and $Y_-$. Outputs of the two tri-state buffers 39 and 40 are synthesized as an equalization target pattern at a point 43 and supplied to the equalization error calculating section 4 which is constructed by an adder. In the equalization error calculating section 4, the equalization target pattern F is subtracted from the equalization output signal C, thereby producing the equalization error E. The characteristics of the linear automatic equalizer 12 are successively corrected by using the value of the equalization error E. On the other hand, a signal 45 which is obtained by subtracting the amplitude value $Y_-$ from the amplitude value $Y_+$ by an adder 44 is multiplied into $\frac{1}{2}$ by a coefficient device 46 and is, further, subtracted from the pattern signal B by the input signal level shifting section 31 which is constructed by an adder and the 0 level of the pattern signal B is corrected.

In the parameter calculating section 32, although the 0 level correction amount has been calculated by using the adder 44 and the coefficient device 46, such a portion can be also constructed by a memory device.

In the embodiment, the non-linearity of the reproduction waveform by the magnetic head of the magnetoresistive effect type can be eliminated by an extremely simple construction. Further, the input/output relation of the portion of the linear automatic equalizer 12 is almost linear and a fixed value is used for the portion in which the non-linearity is corrected, so that it is extremely stable.

The equalization error E will now be further described.

Figure 11:
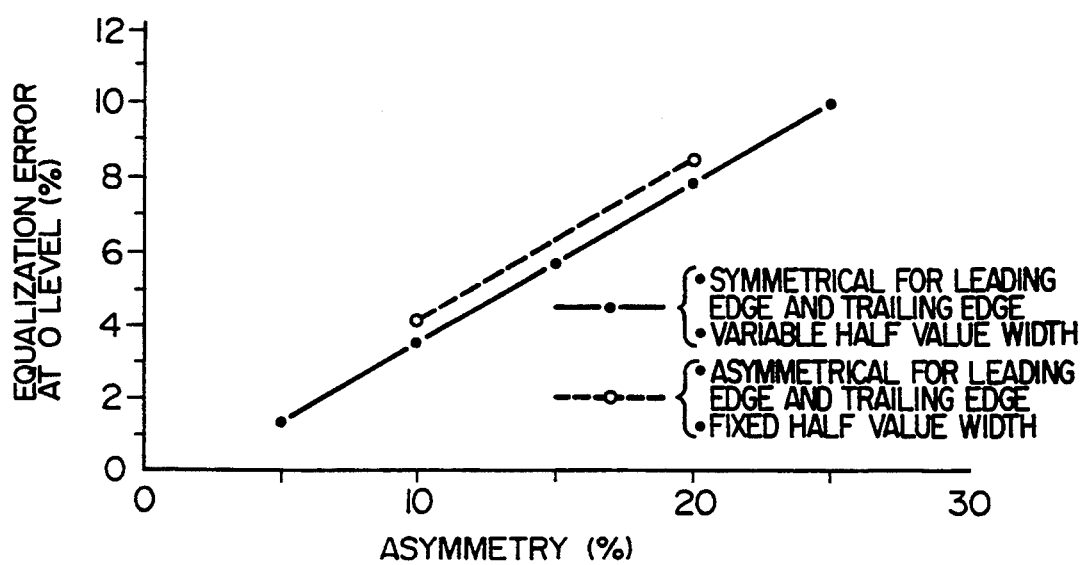
FIG. 11 is a graph for explaining the operation of the automatic equalizer.

FIG. 11 shows an average value of the equalization error E at only the 0 level for the asymmetry of the waveform of the equalization output signal C. The asymmetry is defined as follows on the assumption that the amplitudes of the isolated wave at the positive and negative signs are respectively set to $Y_+$ and $Y_-$.

$$\{(Y_+) - (Y_-)\} / \{(Y_+) + (Y_-)\}$$

The equalization error E at the 0 level is standardized by the amplitude and is shown as an average value. It has been found out from the above result that there is a strong correlation between the asymmetry and the equalization error E at the 0 level and that it is not concerned with the ratio and magnitudes of the half value widths of the leading edge and trailing edge of the isolated wave.

Therefore, by correcting the lacked DC component by using the equalization error E at the 0 level and by resetting the equalization target pattern into an unbalanced state due to a difference of the positive and negative signs, even the linear automatic equalizer 12 can perform the accurate equalization without substantially being exerted by an influence of the non-linearity.

Figure 12:
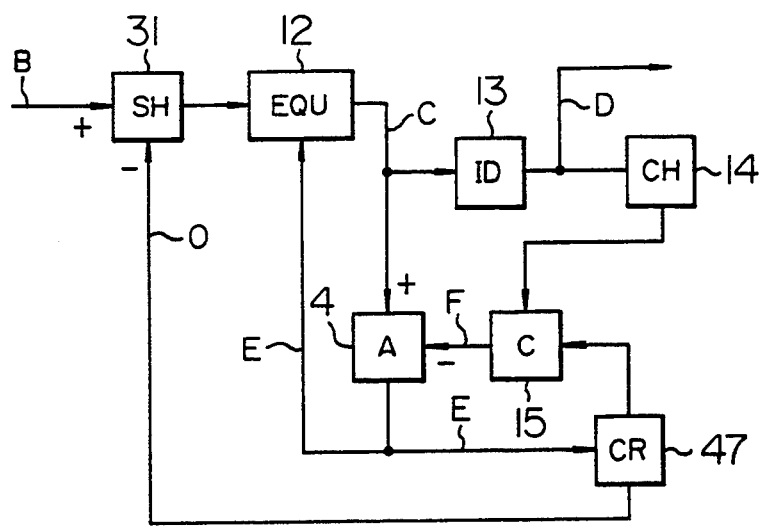
FIG. 12 is a circuit constructional diagram showing a reproduction signal processing apparatus according to the seventh embodiment.

FIG. 12 shows the seventh embodiment of the reproduction signal processing apparatus of the present invention.

The reproduction signal processing apparatus will now be described with reference to FIG. 12. The apparatus comprises: the discriminator 13 for discriminating the equalization output signal C of the linear automatic equalizer 12; the pattern switch 14 for switching from the discrimination code D as a result of the discrimination to the equalization pattern H which differs with respect to the positive and negative signs; the target partial response pattern converting section 15 for selecting the equalization target pattern F on the basis of the equalization pattern H; the equalization error calculating section 4 for subtracting the equalization target pattern F from the equalization output signal C of the linear automatic equalizer 12 and for calculating the equalization error E; an equalization target pattern correcting section 47 for correcting the equalization target pattern F which differs with respect to the positive and negative signs by using the discrimination data D and the equalization error E and for correcting the shift amount O at the 0 level; and the input signal level shifting section 31 for subtracting the shift amount O at the 0 level from the pattern signal B and for supplying as an input to the linear automatic equalizer 12.

Figure 16:
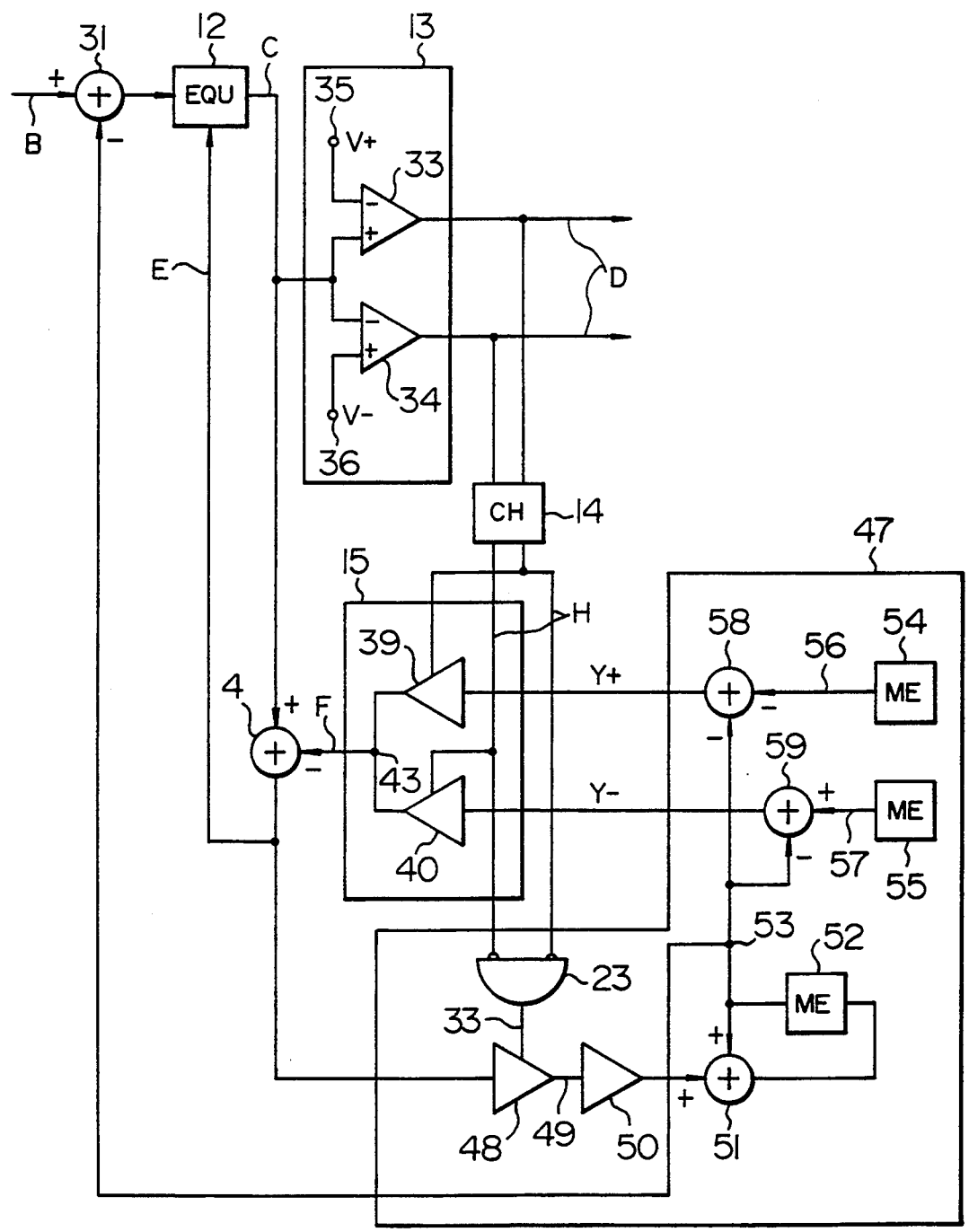
FIG. 16 is a circuit diagram showing a practical example of the reproduction signal processing apparatus shown in FIG. 12.

FIG. 16 shows a practical example of the reproduction signal processing apparatus shown in FIG. 12. The operation will now be described with reference to FIG. 16. The embodiment relates to a system in which the non-linearity at the different sign of the pattern signal B as a reproduction waveform is automatically detected and is corrected simultaneously with the linear automatic equalization. As shown in FIG. 16, a construction is almost similar to that in the sixth embodiment except that in place of the parameter calculating section 32, the equalization target pattern correcting section 47 to correct the equalization target pattern F and the 0 level correction amount by using the equalization error E at the 0 level is provided. The equalization target pattern correcting section 47 comprises: a tri-state buffer 48 which operates only when the discrimination data D is equal to 0; a portion which is constructed by a coefficient device 50, an adder 51, and a memory device 52 for successively accumulating a buffer output 49 and for using it as a correction amount of the equalization target pattern F; and a portion which subtracts a value 53 from the memory device 52 from values 56 and 57 of memory devices 54 and 55 by adders 58 and 59 and obtains the amplitude values $Y_+$ and $Y_-$ (equalization target pattern F) and also sets into a 0 level correction amount. Initial values of the memory devices 54 and 55 are set to $+1$ and $-1$, respectively. Each time the discriminator 13 detects 0, the equalization target pattern and the 0 level correction amount are updated. Each time the equalization error E at the 0 level decreases, the correction amount also approaches a predetermined value.

Figure 17:
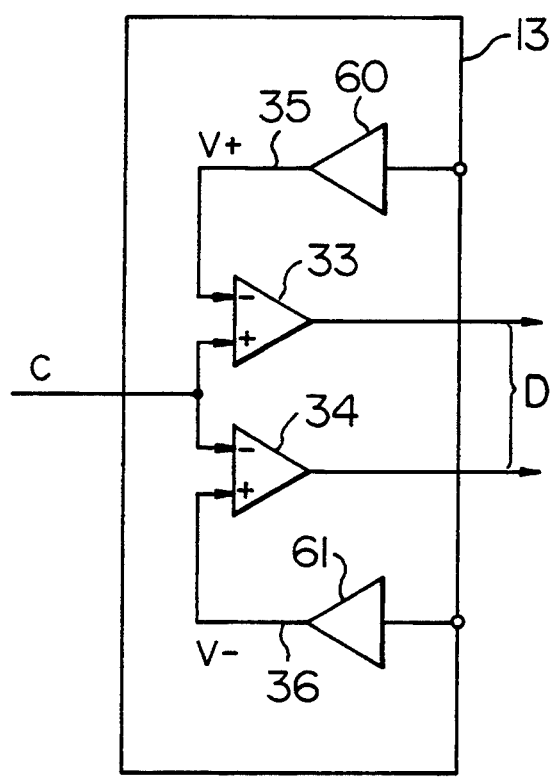
FIG. 17 is a circuit diagram showing a practical example of a discriminator.

In the embodiment, the equalization target pattern F and the 0 level correction amount have been corrected by using only the equalization error E when 0 has been discriminated. However, it will be obviously understood that the equalization error E at $+1$ and $-1$ can be also used to set the equalization target pattern F. As shown in FIG. 17, by producing discrimination potentials $V_+$ and $V_-$ of the discriminator 13 from the equalization target pattern F by adding coefficient devices 60 and 61, a converging speed and a precision can be improved.

In the embodiment as well, an integration by using analog devices or a formation of a digital IC can be easily realized.

In the embodiment, the non-linearity can be eliminated by an extremely simple construction and a converging speed is so fast to be about 100 bits. By giving proper initial values for the memory devices 52, 54, and 55, the improvement of the converging speed can be expected.

Further, by reducing the coefficient value of the coefficient device 50 at a converged time point, an influence by a discrimination error can be reduced.

Figure 18:
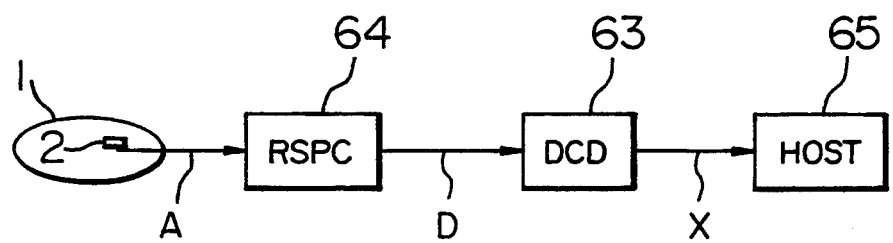
FIG. 18 is a circuit constructional diagram showing a magnetic recording and reproducing apparatus of the present invention.

FIG. 18 shows a magnetic recording and reproducing apparatus using the reproduction signal processing apparatus which has been described in the first to seventh embodiments so far. The recording data on the magnetic disk 1 is read by the magnetic head 2. The reproduction signal A is supplied to a reproduction signal processing apparatus 64. As already been described above, the discrimination data D is outputted from the reproduction signal processing apparatus 64. The discrimination code D is supplied to a decoding circuit 63. A decoding signal X is outputted from the decoding circuit 63. The decoding signal X is transferred to a higher-order apparatus 65 and the recording data recorded on the magnetic disk 1 is reproduced. By supplying the amplitude values $Y_+$ and $Y_-$ shown in FIGS. 15 and 16 to the decoding circuit 63, the performance of the decoding circuit 63 can be improved. According to the magnetic recording and reproducing apparatus 64 described above, all components of the apparatus 64 can be produced with a single chip, or an LSI (Large Scale Integrated Circuit).

Figure 13:
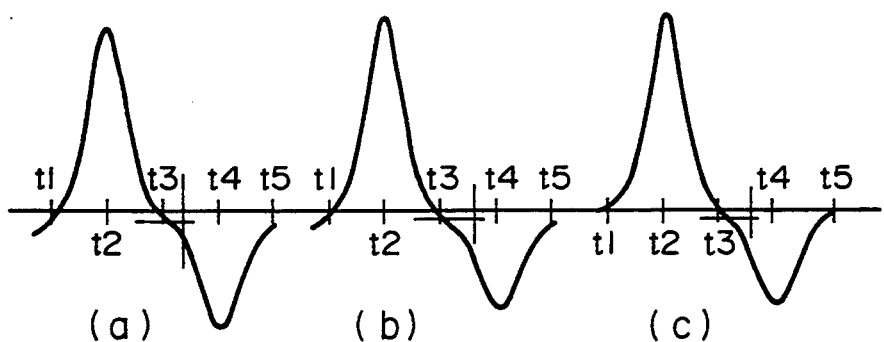
FIGS. 13 and 14 are graphs for explaining the operation of the automatic equalizer.

The equalizing operation using the automatic equalizer 12 of the sixth and seventh embodiments will be further described with reference to FIGS. 13 and 14.

Referring now to FIG. 13(a) showing an initial state, since the DC component lacks in the pattern signal B, the 0 level of the equalization output signal C which has been equalized by the linear automatic equalizer 12 in a state in which the amplitudes of the positive and negative signs are asymmetric is shifted. Now, assuming that the equalization output signal C is discriminated as 0 by the discriminator 13 at time $t_1$, the target partial response pattern converter 15 which selects the equalization target pattern F supplies 0 to the equalization error calculating section 4 to calculate the equalization error E, so that the equalization error E as an output of the equalization error calculating section 4 to calculate the equalization error E is nothing but the equalization output signal C. The equalization error E is sent to the automatic equalizer 12 as information for correction of the coefficient of the linear automatic equalizer 12. The equalization error E is also sent to the equalization target pattern correcting section 47 to correct the equalization target pattern F and the 0 level shift amount. The equalization target pattern F and the 0 level shift amount O are corrected. The equalization and correction are sequentially repeated by the corrected 0 level correction amount and the corrected equalization target pattern F. As the equalization and the correction progress, the equalization output signal C changes as shown in FIGS. 13(b) and 13(c). The equalization and the 0 level correction are certainly executed. The equalization target pattern F and the 0 level shift amount are converged in a period of time which is almost equal to a period of time that is needed for convergence of the automatic equalizer 12. Although the amplitudes of the equalization output signal C are asymmetrical with respect to the positive and negative signs, they can be easily corrected to become symmetrical by using the discrimination code D and the equalization target pattern F.

Figure 14:
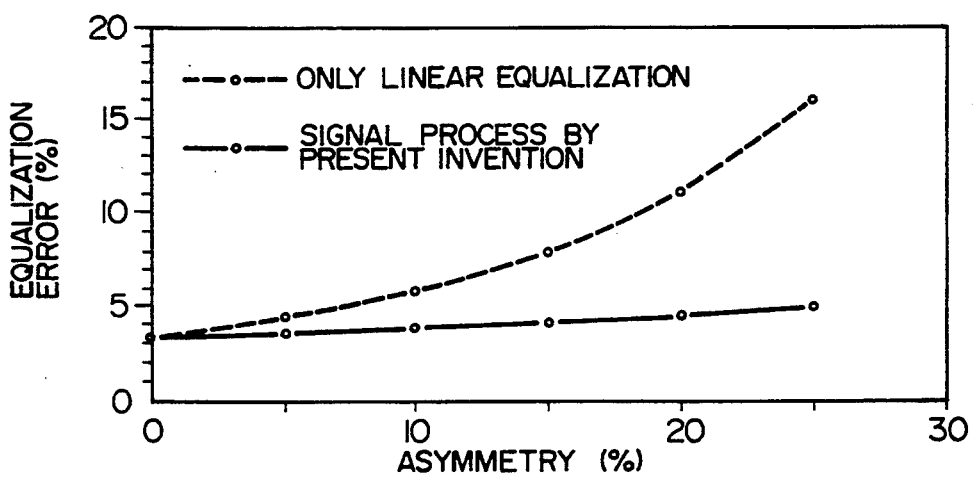

FIG. 14 shows the result of the comparison of the equalization errors E in case of a construction using only the linear equalizer and in case of the construction by the present invention. It will be understood that the error which is considered to be caused due to the asymmetry of the waveform of the reproduction signal is almost eliminated by the present invention.

What is claimed is:

1. A reproduction signal processing apparatus for generating an equalization signal by equalizingly correcting variation of a reproduction signal reproduced from recording information on an information recording medium by an automatic equalizer, comprising:
   a memory means for storing a write data pattern to decide equalizing characteristics of said automatic equalizer in response to variation of said reproduction signal;
   a pattern convening means for converting said write data pattern outputted from said memory means into an equalization target pattern as a target for equalization and correction by said automatic equalizer;
   an equalization error calculating means for producing an equalization error from said equalization target pattern and said equalization signal outputted from said automatic equalizer; and
   said automatic equalizer being connected to an A/D converting means for converting said equalization signal outputted from said automatic equalizer into a digital signal, said A/D convening means being further connected to a discriminator, and said discriminator outputting a discrimination code digitalized with a polarity.

2. An apparatus according to claim 1, wherein said pattern converting means has a discriminator for discriminating a polarity of said equalization signal outputted from said automatic equalizer and for outputting a discrimination code, and said pattern converting means converts said discrimination code from said discriminator and said write data pattern stored in said memory means into said equalization target pattern as a target of equalization and correction by said automatic equalizer.

3. An apparatus according to claim 2, wherein said pattern converting means comprises:
   a training pattern storing memory for storing a training pattern to initialize equalizing characteristics of said automatic equalizer;
   a target partial response pattern converter for converting said training pattern into an equalization pattern corresponding to a waveform after executing a partial response waveform process;
   a discriminator for discriminating a sign of said equalization signal outputted from said automatic equalizer and for outputting said discrimination code;
   a pattern switch for selecting said equalization pattern from said training pattern on a basis of said discrimination code upon initialization of said automatic equalizer; and
   an equalization target value selector for selecting an equalization target value from said equalization pattern.

4. A reproduction signal processing apparatus for generating an equalization signal by equalizingly correcting variation of a reproduction Signal reproduced from recording information on an information recording medium by an automatic equalizer, comprising:
   a memory means for storing a write data pattern to decide equalizing characteristics of said automatic equalizer in response to variation of said reproduction signal;
   a pattern converting means for converting said write data pattern outputted from said memory means into an equalization target pattern as a target for equalization and correction by said automatic equalizer;
   an equalization error calculating means for producing an equalization error from said equalization target pattern and said equalization signal outputted from said automatic equalizer; and
   said automatic equalizer for executing a partial response waveform process of said reproduction signal on a basis of said equalization error and for Correcting predetermined equalizing characteristics of said automatic equalizer while tracing a variation of said reproduction signal;
   wherein said automatic equalizer is connected to an A/D converting means for converting said equalization signal outputted from said automatic equalizer into a digital signal, and said A/D converting means is further connected to a discriminator, said discriminator outputting a discrimination code digitalized with a polarity.

5. An apparatus according to claim 1, wherein said automatic equalizer is connected to a simplified discriminator for outputting said discrimination code discriminated from a polarity of said equalization signal outputted from said automatic equalizer to output at every predetermined equalization target, by supplying said discrimination code to said pattern convening circuit, said equalization target pattern being produced from said discrimination code and said predetermined pattern.

6. An apparatus according to claim 4, wherein an A/D converting means for convening said reproduction signal into said digital signal is connected to said automatic equalizer, and said reproduction signal supplied to said automatic equalizer is digitalized.

7. An apparatus according to claim 1, wherein a constant memory storing a constant to decide equalizing characteristics of said automatic equalizer is connected to said automatic equalizer.

8. A reproduction signal processing apparatus for generating an equalization signal by equalizingly correcting variation of a reproduction signal reproduced from recording information on an information recording medium by an automatic equalizer, comprising:
   a memory means for Storing a write data pattern to decide equalizing characteristics of said automatic equalizer in response to variation of said reproduction signal;
   a pattern converting means for converting said write data pattern outputted from said memory means into an equalization target pattern as a target for equalization and correction by said automatic equalizer;
   an equalization error calculating means for producing an equalization error from said equalization target pattern and said equalization signal outputted from said automatic equalizer: and
   said automatic equalizer for executing a partial response waveform process of said reproduction Signal on a basis of said equalization error and for correcting predetermined equalizing characteristics of said automatic equalizer while tracing a variation of said reproduction signal;
   wherein an input signal level shifting section for receiving said reproduction signal is connected to said automatic equalizer, and a parameter calculating section for receiving said reproduction signal to supply a shift amount at a 0 level of said reproduction signal to said input signal level shifting section is connected to said pattern convening means, and wherein amplitudes of positive and negative polarities are measured from an isolated wave of said reproduction signal by said parameter calculating section, and said equalization target pattern is produced on a basis of said amplitudes.

9. A reproduction signal processing apparatus for generating an equalization signal by equalizingly correcting variation of a reproduction Signal reproduced from recording information on an information recording medium by an automatic equalizer, comprising:
   a memory means for storing a write data pattern to decide equalizing characteristics of said automatic equalizer in response to variation Of said reproduction signal;
   a pattern converting means for converting said write data pattern outputted from said memory means into an equalization target pattern as a target for equalization and correction by said automatic equalizer;
   an equalization error calculating means for producing an equalization error from said equalization target pattern and said equalization Signal outputted from said automatic equalizer; and
   said automatic equalizer for executing a partial response waveform process of said reproduction signal on a basis of said equalization error and for correcting predetermined equalizing characteristics of said automatic equalizer while tracing a variation of said reproduction signal;
   wherein an input signal level shifting section for receiving said reproduction signal is connected to said automatic equalizer, an equalization target pattern correcting section for supplying a shift amount at a 0 level of said reproduction signal is connected to said input signal level shifting section, and wherein said equalization target pattern is corrected on a basis of said equalization error by said equalization target pattern correcting section.

10. An apparatus according to claim 1, wherein said automatic equalizer comprises:
   an executing means for executing a partial response waveform process of said reproduction signal on a basis of said equalization error; and
   a correcting means for correcting predetermined equalizing characteristics of said automatic equalizer while tracing variation of said reproduction signal.

11. An apparatus according to claim 10, wherein said executing means comprises a plurality of delay elements connected in series so as to receive said reproduction signal, multipliers respectively connected to taps formed among said delay elements and taps formed at both ends of said plurality of delay elements, and adders connected to respective said multipliers except for an input multiplier on an input side receiving said reproduction signal among said multipliers, in which said input multiplier on the input side is connected to an input adder on the input side and each output of said adders is sequentially connected to each respective adder at a next stage, and said equalization signal is outputted from an output adder at a final stage, and
   said correcting means comprises a characteristics corrector receiving said reproduction signal, for calculating updating values of said equalizing characteristics, and for outputting an up/down signal and a group of counters holding equalizing characteristics in correspondence to said multipliers, for supplying equalizing characteristics to each of said multipliers in accordance with said up/down signal.

12. An apparatus according to claim 11, wherein even number of taps are formed by serially connecting said plurality of delay elements.

13. An apparatus according to claim 11, wherein odd number of taps are formed by serially connecting said plurality of delay elements.

14. A magnetic recording and reproducing apparatus having a reproduction signal processing apparatus for generating an equalization signal by equalizingly correcting variation of a reproduction signal reproduced from recording information on an information recording medium by an automatic equalizer, comprising:
   an input circuit including a preamplifier to amplify said reproduction signal, an AGC (Automatic Gain Control) circuit, and a filter;
   a memory circuit storing a write data pattern for initialization of said automatic equalizer, for deciding equalizing characteristics of said automatic equalizer in response to variation of said reproduction signal;
   a discriminator discriminating a polarity of said equalization signal outputted from said automatic equalizer, for outputting a discrimination code;
   a pattern converting circuit for converting said write data pattern outputted from said memory circuit into an equalization target pattern serving as a target of equalization and correction by said automatic equalizer on a basis of said discrimination code outputted from said discriminator;
   an equalization error calculating circuit for producing an equalization error from said equalization target pattern and equalization signal outputted from said automatic equalizer; and
   said automatic equalizer being connected to an A/D converting means for converting said equalization signal outputted from said automatic equalizer into a digital signal, .said A/D converting means being further connected to a discriminator, and said discriminator outputting a discrimination code digitalized with a polarity, in which said input circuit, said memory circuit, said discriminator, said pattern converting circuit, said equalization error calculating circuit, and said automatic equalizer are incorporated in an integrated circuit.

15. A reproduction signal processing method for generating an equalization signal by equalizingly correcting variation of a reproduction signal reproduced from recording information on an information recording medium by an automatic equalizer, said method comprising the steps of:
   a) storing a write data pattern into a memory means to decide equalizing characteristics of said automatic equalizer in response to variation of said reproduction signal;
   b) converting said write data pattern outputted from said memory means into an equalization target pattern so as to be different from positive and negative polarities with use of a reference of a 0 level of said equalization target pattern;
   c) producing an equalization error using an equalization error calculating means from said equalization target pattern and said equalization signal outputted from said automatic equalizer; and
   d) executing a partial response waveform process of said reproduction signal on a basis of said equalization error and correcting predetermined equalizing characteristics of said automatic equalizer by tracing variation of said reproduction signal.

16. A reproduction signal processing method for generating an equalization signal by equalizingly correcting variation of a reproduction signal reproduced from recording information on an information recording medium by an automatic equalizer, said method comprising the steps of:
   a) storing a write data pattern into a memory means to decide equalizing characteristics of said automatic equalizer in response to variation Of said reproduction signal;
   b) converting said predetermined pattern outputted from said memory means into an equalization target pattern serving as a target of equalization and correction by pattern converting means:
   c) producing an equalization error using an equalization error calculating means from said equalization target pattern and said equalization signal outputted from said automatic equalizer; and
   d) executing a partial response waveform process of said reproduction signal on a basis of said equalization error and correcting predetermined equalizing characteristics of said automatic equalizer by tracing variation of said reproduction signal
   wherein said equalization target pattern is converted so as to be different from positive and negative polarities with use of a reference of a 0 level of said equalization target pattern.

17. A method according to claim 16, wherein in said step d), a DC level of a pattern signal supplied to said automatic equalizer is adjusted by using a correction amount at a 0 level calculated from said equalization error so as to reduce an error at a 0 level of said equalization signal outputted from said automatic equalizer.

18. A reproduction signal processing method for generating an equalization signal by equalizingly correcting variation of a reproduction signal reproduced from recording information on an information recording medium by an automatic equalizer, said method comprising the steps of:
   a) storing a write data pattern for initialization of said automatic equalizer into a memory means to decide equalizing characteristics of said automatic equalizer in response to variation of said reproduction signal;
   b) converting said write data pattern outputted from said memory means into an equalization target pattern serving as a target of equalization and correction by a pattern converting means;
   c) producing an equalization error by an equalization error calculating means from said equalization target pattern and said equalization signal outputted from said automatic equalizer; and
   d) executing a partial response waveform process of said reproduction signal on a basis of said equalization error and correcting predetermined equalizing characteristics of said automatic equalizer by tracing variation of said reproduction signal;
   wherein said automatic equalizer is connected to an A/D converting means which performs a step of converting said equalization signal outputted from said automatic equalizer into a digital signal, and said A/D converting means is further connected to a discriminator which performs a step of outputting a discrimination code digitalized with a polarity.

19. A reproduction signal processing apparatus for generating an equalization signal by equalizingly correcting variation of a reproduction signal reproduced from recording information on an information recording medium by an automatic equalizer, comprising:
   a memory means for storing a write data pattern for initialization of said automatic equalizer to decide equalizing characteristics of said automatic equalizer in response to variation of said reproduction signal;
   a pattern converting means for converting said write data pattern outputted from said memory means into an equalization target pattern as a target for equalization and correction by said automatic equalizer;
   an equalization error calculating means for producing an equalization error from said equalization target pattern and said equalization signal outputted from said automatic equalizer; and
   said automatic equalizer for executing a partial response waveform process of said reproduction signal on a basis of said equalization error and for correcting predetermined equalizing characteristics of said automatic equalizer while tracing variation of said reproduction signal, wherein said automatic equalizer is connected to an A/D converting means for convening said equalization signal outputted from said automatic equalizer into a digital signal, and said A/D converting means is further connected to a discriminator, said discriminator outputting a discrimination code digitalized with a polarity.

20. A method apparatus according to claim 18, wherein in step b.), said equalization target pattern is converted so as to be different from positive and negative polarities with use of a reference of a 0 level of said equalization target pattern.

* * * * *